(12) United States Patent
Prete et al.

(10) Patent No.: US 7,721,130 B2
(45) Date of Patent: May 18, 2010

(54) APPARATUS AND METHOD FOR SWITCHING AN APPARATUS TO A POWER SAVING MODE

(75) Inventors: Edoardo Prete, Munich (DE); Hans-Peter Trost, Munich (DE); Anthony Sanders, Haar (DE); Dirk Scheideler, Munich (DE); Georg Braun, Holzkirchen (DE); Steve Wood, Munich (DE); Richard Johannes Luyken, Munich (DE)

(73) Assignee: Qimonda AG, Munich (DE)

( * ) Notice: Subject to any disclaimer, the term of this patent is extended or adjusted under 35 U.S.C. 154(b) by 656 days.

(21) Appl. No.: 11/604,666

(22) Filed: Nov. 27, 2006

(65) Prior Publication Data

US 2008/0126816 A1   May 29, 2008

(51) Int. Cl.
G06F 1/00 (2006.01)
G06F 1/26 (2006.01)
G06F 1/32 (2006.01)

(52) U.S. Cl. .............. 713/323; 713/300; 713/320; 711/5; 711/106; 711/167; 711/170; 365/221

(58) Field of Classification Search .............. 713/300, 713/323, 320; 711/170, 106, 5, 167; 365/221
See application file for complete search history.

(56) References Cited

U.S. PATENT DOCUMENTS

| | | | | |
|---|---|---|---|---|
| 5,357,621 A | * | 10/1994 | Cox | 711/172 |
| 6,378,018 B1 | * | 4/2002 | Tsern et al. | 710/313 |
| 6,650,594 B1 | * | 11/2003 | Lee et al. | 365/233.15 |
| 2004/0148482 A1 | * | 7/2004 | Grundy et al. | 711/167 |
| 2004/0193829 A1 | * | 9/2004 | Woo et al. | 711/170 |
| 2006/0184287 A1 | * | 8/2006 | Belady et al. | 700/291 |
| 2006/0248355 A1 | * | 11/2006 | Thayer | 713/300 |
| 2007/0076502 A1 | * | 4/2007 | Pyeon et al. | 365/221 |
| 2007/0083701 A1 | * | 4/2007 | Kapil | 711/106 |
| 2007/0143542 A1 | * | 6/2007 | Watanabe et al. | 711/114 |
| 2007/0283178 A1 | * | 12/2007 | Dodeja et al. | 713/324 |

OTHER PUBLICATIONS

Nasr, Marwan Rami, "FBSIM and the Fully Buffered DIMM Memory System Architecture," Thesis, 2005, pp. 1-128, University of Maryland.

* cited by examiner

Primary Examiner—Thomas Lee
Assistant Examiner—Vincent T Tran
(74) Attorney, Agent, or Firm—Slater & Matsil, L.L.P.

(57) ABSTRACT

An apparatus being connectable as a latch stage into a asynchronous latch chain comprises a reception interface, wherein upon receipt of the first signal at the reception interface, the apparatus switches to one of the first power saving mode and a second power saving mode, depending on the second signal at the reception interface and wherein the apparatus offers a first power consumption and a first wake-up time in the first power saving mode, and a second power consumption and a second wake-up time in the second power saving mode.

33 Claims, 2 Drawing Sheets

APPARATUS AND METHOD FOR SWITCHING AN APPARATUS TO A POWER SAVING MODE

TECHNICAL FIELD

The present invention relates to an apparatus and method for switching an apparatus to a power saving mode, for instance to an apparatus being connectable, as a latch stage into an asynchronous latch chain, for instance, a memory buffer for a memory bus in a memory system.

BACKGROUND

Modern computer systems offer a significant amount of computing power, as well as a large memory capacity, which enables fast and highly complex computations, as well as fast handling and processing of data. However, in modern computer systems, a key issue is the power management and power consumption. For instance, in the field of mobile computing, the available power is limited by the accumulators and/or the batteries available. Moreover, in the field of stationary computers, power consumption is a great issue, as the power dissipated has to be transported away from the components preventing overheating of the respective circuitries and components.

Many computer systems and components of computer systems offer a power saving mode, in which components of the computer system are turned off or shut down. An example for a computer system or a subsystem of a computer system offering such a power saving mode is the memory system, which is employed in personal computers (PC), servers and workstations. One memory system employed in the mentioned computer systems is referred to as the so-called fully buffered DIMM system or a FBDIMM system (FBDIMM=Fully Buffered Dual Inline Memory Module; DIMM=Dual Inline Memory Module).

Today's concept, especially for high-speed interfaces in FBDIMM systems, however, offers only a single mode to reduce the power consumption of the system. Therefore, a compromise between the power saving and the time needed to switch back from the power saving mode to an active mode, or a normal mode of operation, has to be made since this time is crucial for the system performance.

In other words, measures taken to reduce the power consumption exhibits a strong negative influence on the performance of the computer system, especially the computing power and the available and effective bandwidth of bus structures, which are required for the transport of data between different components of the computer system, for instance, between a processor and the memory. In this context analog circuits used in interfaces exhibit, for example, a large power saving potential but suffer from the fact that they need a long time to recover again since, for instance, control loops and other feedback loops are needed to reach and maintain a stable working point and a stable working condition, before these interfaces can provide a reliable and fast data communication between the components attached.

SUMMARY OF THE INVENTION

An embodiment of an apparatus being connectable, as a latch stage into an asynchronous latch chain comprises a reception interface, wherein upon receipt of a first signal at the reception interface the apparatus switches to one of the first power saving mode and a second power saving mode, depending on the second signal at the reception interface, wherein the apparatus offers a first power consumption and a first wake-up time in the first power saving mode and a second power consumption and a second wake-up time in the second power saving mode.

An embodiment of an apparatus being connectable, as a latch stage into an asynchronous latch chain comprises a reception interface, wherein upon receipt of a first signal at the reception interface the apparatus switches to one of the first power saving mode and a second power saving mode, depending on the second signal at the reception interface, wherein the apparatus offers a first power consumption and a first wake-up time in the first power saving mode and a second power consumption and a second wake-up time in the second power saving mode, wherein the first power consumption is higher than the second power consumption and wherein the first wake-up time is shorter than the second wake-up time.

According to a further embodiment of the present invention, a memory system comprises a memory controller, a plurality of memory modules coupled to the memory controller in an asynchronous latch chain configuration, the plurality of memory modules comprising a first memory module and a second memory module, wherein the first memory module is positioned nearer to the memory controller than the second memory module within the asynchronous latch chain, wherein the first memory module offers a first power consumption and a first wake-up time in a first power saving mode, wherein the second memory module offers a second power consumption and second wake-up time in a second power saving mode, wherein each memory module of the plurality of memory modules comprises a reception interface, wherein upon receipt of a first signal from the memory controller at the reception interface, the first memory module switches to the first power saving mode and the second memory module switches to the second power saving mode, wherein the first power consumption is higher than the second power consumption and wherein the first wake-up time is shorter than the second wake-up time.

BRIEF DESCRIPTION OF THE DRAWINGS

Embodiments of the present invention are described hereinafter, making reference to the attached drawings.

DETAILED DESCRIPTION OF ILLUSTRATIVE EMBODIMENTS

Figure 1:
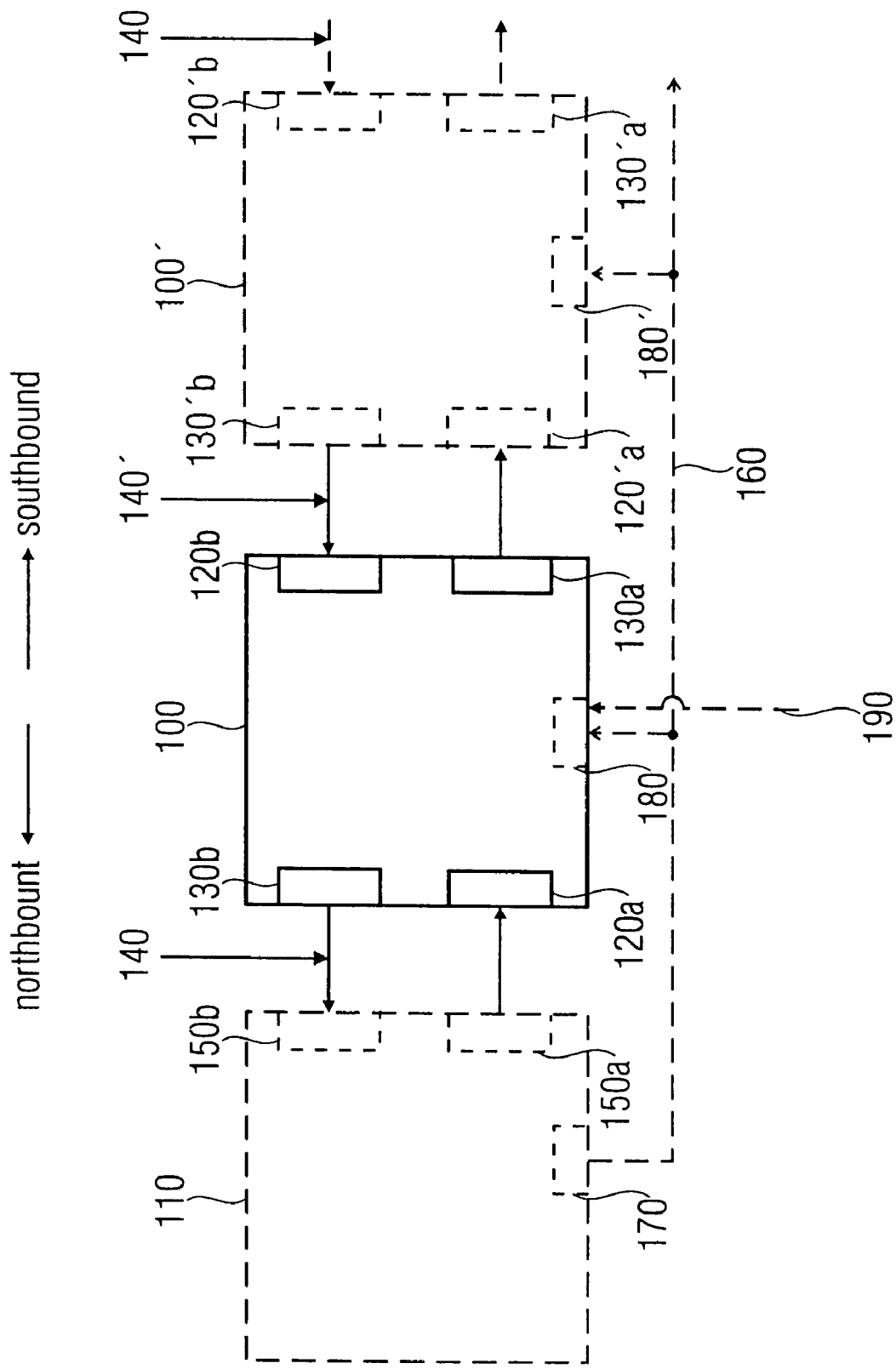
FIG. 1 shows a schematic block diagram of an embodiment of an apparatus according to a first embodiment of the present invention.
Figure 2:
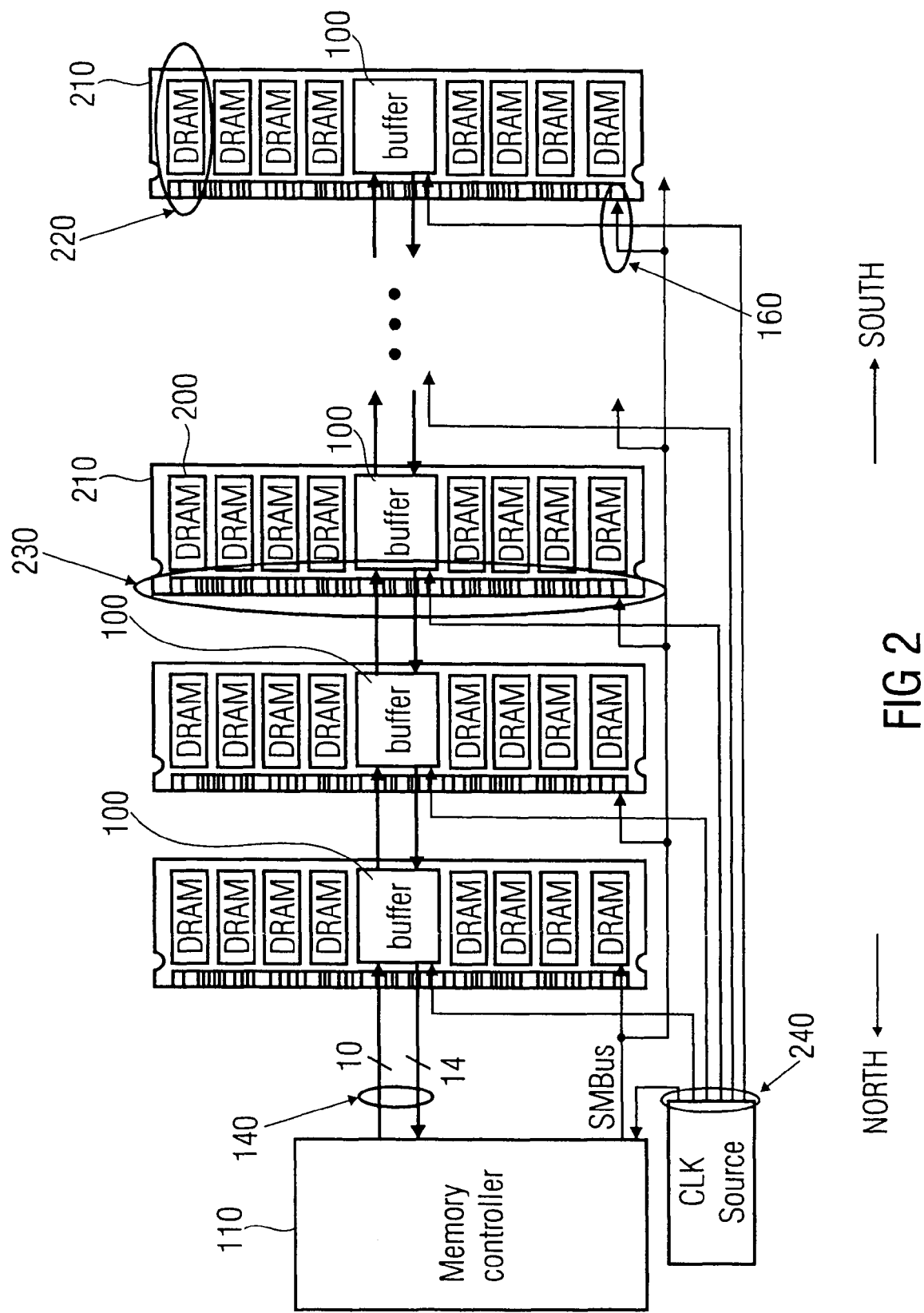
FIG. 2 shows a schematic block diagram of a second embodiment of an apparatus and an embodiment of a memory system according to a second embodiment of the present invention.

FIGS. 1 and 2 show block diagrams of an embodiment of an apparatus being connectable as a latch stage into an asynchronous latch chain and an embodiment of a memory system. Before a second embodiment of the present invention is described with respect to FIG. 2, a first embodiment of an apparatus being connectable as a latch stage into an asynchronous latch chain is explained with respect to the schematic representation of an embodiment of the apparatus and an embodiment of a memory system shown in FIG. 1.

FIG. 1 shows an embodiment of an apparatus 100 integrated into an embodiment of a memory system according to the present invention. The memory system comprises, apart from the apparatus 100 shown in the center of FIG. 1, a further apparatus 100' and a memory controller 110 forming an asynchronous latch chain or a daisy chain as will be explained below.

In a so-called daisy chain configuration, components of the daisy chain, which are also referred to as latch stages of the asynchronous latch chain, communicate only with their direct neighbors, for instance, via a wiring scheme comprising interfaces and signal lines of a bus structure. Hence, only neighboring devices are directly coupled to each other. Furthermore, usually in a daisy chain no web like structures are formed and the coupling of the devices does not loop back, for instance, from the first device to the last device in the daisy chain.

In other words, a typical daisy chain configuration in electrical and electronic engineering is a wiring scheme in which, for example, a first device is coupled or wired to a second device, the second device is coupled to a third device, the third device is coupled to a fourth device, and so on. However, the connections of this daisy chain usually do not form webs or loop backs, as discussed above.

In many daisy chain configurations, each of the devices, therefore, comprises circuits working as repeaters or amplifiers to counteract the natural attenuation of the signals when they are transmitted from one device to the next device. In the case of digital signals being exchanged between the different components of a daisy chain, the digital signals may be transferred via an electrical bus as, for instance, in the case of memory devices. In these cases, however, a bus termination might be advisable to implement to prevent reflections and other disturbances of the signals. However, in the case of digital signals, the digital signals may be electrically regenerated or recreated in each device in the daisy chain, as long as they are not modified.

In other words, a signal transmitted over the bus is passed along through each device's interface circuits instead of being transmitted to all devices (simultaneously) by the devices sharing the same bus. Hence, for instance, transmitting a signal from the first device in the daisy chain to the third device in the daisy chain requires the second device to receive the signal from the first device and to forward or to regenerate the signal to be transmitted to the third device of the daisy chain.

Especially in the field of memory devices, the first or central device in the daisy chain is very often the memory controller 110. Especially in the field of memory devices, the communication in the direction of the memory controller or towards the memory controller 110 is referred to as "northbound" while the opposite direction, the communication from the memory controller to the further devices in the daisy chain is usually referred to as "southbound".

Although embodiments of the present invention are not limited to an application in the field of memory devices, this terminology is adapted in the framework of the present application, as it allows a simple designation of a direction of the communication in the daisy chain or in an asynchronous latch chain.

Turning back to FIG. 1, the apparatus 100 comprises four sub-interfaces 120a, 120b, 130a and 130b. To be more precise, sub-interface 120a is part of a reception interface of the apparatus 100, which is dedicated to receiving northbound signals on a bus 140 coupling the apparatus 100 and the memory controller 110. The second sub-interface 120b, which is dedicated for receiving northbound signal from the further apparatus 100' which is coupled to the apparatus 100 by a bus 140'. Both buses 140 and 140' comprise in the embodiment of a memory system shown in FIG. 1, sub-bus structures for northbound and southbound communications.

Accordingly, the apparatus 100 further comprises, apart from the sub-interface 120a coupled to the southbound bus structure of the bus 140, the further sub-interface 130a coupled to the southbound bus structure of the bus 140'. With respect to the northbound communication and the northbound bus structures of the buses 140 and 140' the apparatus 100 comprises apart from the interface 120b coupled to the northbound bus structure of the bus 140', the further sub-interface 130b coupled to the northbound bus structure of the bus 140.

While the two sub-interfaces 120a and 120b are dedicated to receiving signals southbound via the bus 140 and northbound via the bus 140', respectively, the sub-interfaces 130a and 130b are dedicated to transmitting or sending signals over the southbound bus structure of the bus 140' and the northbound bus structure of the bus 140, respectively.

As a consequence, the two sub-interfaces 120a and 120b are part of a reception interface of the apparatus 100, while the sub-interfaces 130a and 130b are part of a transmission interface of the apparatus 100. The further apparatus 100' of the memory system shown in FIG. 1 comprises also four sub-interfaces 120'a, 120'b, 130'a and 130'b, which are dedicated for receiving or sending signals via the buses 140' and 140", coupled to the further apparatus 100'. Compared to the apparatus 100, the bus 140' is coupled to the sub-interfaces 120'a and 130'b of the further apparatus 100', while the bus 140" is coupled to the sub-interfaces 130'a and 120'b.

The embodiment of the memory system shown in FIG. 1 further comprises the memory controller 110, which is coupled to the embodiment of the apparatus 100 via the bus 140. The southbound bus structure of the bus 140 is coupled to a sub-interface 150a of the memory controller 110 while the northbound bus structure of the bus 140 is coupled to a sub-interface 150b of the memory controller 110. The sub-interface 150a is, therefore, adapted for transmitting or sending signals via the southbound bus structure of the bus 140 to the sub-interface 120a of the apparatus 100, which is adapted for receiving the signals. Accordingly, the sub-interface 150b of the memory controller 110 is adapted to receiving signals sent via the northbound bus structure of the bus 140, provided by the sub-interface 130b of the apparatus 100.

As a further option, the memory controller 110, the apparatus 100 and the further apparatus 100' can be coupled to a signal line 160, which can, for instance, be an individual signal line or part of a unidirectional or bidirectional bus. The signal line 160 is coupled to an optional interface 170 of the memory controller 110 and two interfaces 180 and 180' of the apparatus 100 and the further apparatus 100' respectively. The signal line 160 can, for instance, be employed by the memory controller 110 to provide the apparatuses 100 and 100' with commands, data, status requests and other signals, so that the interfaces 180 and 180' of the apparatus 100 and the further apparatus 100' are capable of receiving signals from the memory controller. In this case, the interfaces 180 and 180' are also part of the reception interfaces of the apparatus 100 and the further apparatus 100', respectively.

The reception interface of the apparatus 100 comprises all interfaces, connectors, (mechanical) jumpers, switches (DIP switches) and terminals, which are designated for and/or capable of receiving signals. In the embodiment of a memory system shown in FIG. 1, the reception interface of the apparatus 100 comprises the sub-interfaces 120a and 120b and, if present, the optional interface 180.

Accordingly, the transmission interface, also referred to as the sending interface of the apparatus 100, comprises the sub-interfaces 130a and 130b, as well as, if the interface 180 is capable of sending data, commands or other signals, the interface 180. Furthermore, the reception interface of the apparatus 100 furthermore comprises, depending on the concrete implementation and if present, a signal line for a clock signal (CLK) and further, high speed or low speed buses or signal lines being capable of transmitting data towards the apparatus 100 (e.g. SM bus in case of a FBDIMM system), if present.

Furthermore, the apparatus 100 can be connected to a further signal line 190, which is also an optional signal line. Via the signal line 190, which can, for instance be, coupled to an interface 180 of the apparatus 100, the apparatus 100 can furthermore be supplied with signals from further components of memory system, not shown in FIG. 1.

As the apparatus 100 is connectable as a latch stage into an asynchronous latch chain, the sub-interfaces 120*a* and 130*a* form an asynchronous latch chain interface for the southbound communication, whereas the sub-interfaces 120*b* and 130*b* form an asynchronous latch chain interface for northbound communication.

The apparatus 100, as well as the further apparatus 100', offers, apart from a normal mode of operation, in which the apparatus provides its functionality depending on its concrete implementation, at least a first power saving mode and a second power saving mode, wherein the apparatus 100 provides a first power consumption in the first power saving mode and a second consumption in the second power saving mode. The power consumption of the normal mode of operation is typically higher compared to the first power consumption in the first power saving mode. Furthermore, in some embodiments the first power consumption is higher than the second power consumption of a second power saving mode. However, in some embodiments, the first power consumption and the second power consumption can be equal.

The apparatus 100, furthermore, requires a first wake-up time to recover from the first power saving mode and to enter the normal mode of operation fully. Accordingly, the apparatus 100 requires a second wake-up time to recover from the second power saving mode and to re-establish the normal mode of operation fully. Depending on the embodiment of an apparatus 100, the first wake-up time and the second wake-up time can also be equal. However, in most cases, at least one of the power consumptions and the wake-up times of the respective power saving modes differ. In other words, the first power consumption and the second power consumption or the first wake-up time and the second wake-up time can in principle, be identical or equal. However, the second power saving mode provides typically compared to the first power saving mode a smaller power consumption, while the second wake-up time when compared to the first wake-up time of the first power saving mode is larger. The apparatus 100 offers, apart from the normal mode of operation, at least two different power saving modes, wherein the larger power saving capability of the respective power saving mode, compared to the normal mode of operation, the larger the wake-up time required for the apparatus 100 to re-reach to normal mode of operation.

In this context, it should be noted that neither the power consumption of a respective power saving mode nor the power saving capability of a respective power saving mode, compared to the normal mode of operations scales on a mathematical sense with the wake-up time of the respective power saving mode. In other words, the wake-up time and the set of power consumptions or power saving capabilities of the respective power saving mode do not necessarily follow (mathematical) a relation.

The apparatus 100 is capable of being provided with a first signal indicating to switch from the normal mode of operation to one of the at least two power saving modes, wherein the power saving modes to be entered upon reception of the first signal is selected on the basis of the second signal. Both the first signal and the second signal are provided to the reception interface of the apparatus 100.

Depending on the concrete implementation, each of the two signals can, for instance, be provided via the southbound buses 140, 140', 140" via the sub-interfaces 120*a*, 120'*a* or via the signal line 160 coupled to the interfaces 180, 180' or via the signal line 190 coupled to the interface 180. In other words, the second signal indicative of the power saving mode to be switched to upon receipt of the first signal can be provided by the controller 110 (via an apparatus 100, 100' in the case of the apparatus 100 not being connected directly to the controller 110 and the signal not being transmitted over the optional signal line 160) or via the signal line 190 from an external component not shown in FIG. 1. Also the first signal, instructing the apparatus 100 to enter the selected power saving mode, can be received from the controller 110 (via an apparatus 100, 100' in the case that the apparatus 100 is not coupled directly to the controller 110 and the signal is not transmitted on the signal line 160) or from an external component via the signal line 190 not shown in FIG. 1.

While the first signal is provided to an embodiment of an apparatus 100 in a concrete implementation to switch the apparatus in one power saving mode, the second signal is intended to provide the apparatus with information concerning its position or location in the daisy chain of the implementation and optionally to provide the apparatus with information concerning the length of the daisy chain. Hence, the power saving mode is determined by the position of the apparatus on the daisy chain.

As outlined before, the second signal intended to select the power saving mode, can be provided to the embodiment of an apparatus as a physical signal, via an access to a register via the SM bus in the case of the FBDIMM architecture as during a training phase via data, commands and other signals sent southbound to be stored in a register or memory cell of a memory of an embodiment of an apparatus 100.

Depending on the implementation and the circumstances, the embodiments of the present invention in the form of the apparatus 100 can be provided with the second signal in the framework of start up sequence, providing the apparatus 100 with necessary, required optional information concerning the normal mode of operation. For instance, in the case of a memory buffer, the second signal can comprise of information concerning the position of the apparatus 100 in the asynchronous latch chain, which can, for instance, be used in the case of a memory buffer to designate an address to at least one memory unit of a memory device being connected to the special embodiment of the apparatus in the form of a memory buffer. In other words, the second signal can be used in this example, not only to define the power saving mode, but also to define the basic address for at least one memory device being connected to an embodiment of the apparatus 100.

The second signal can provide an embodiment of the apparatus 100 with information concerning the position of the apparatus as a latch stage in the asynchronous latch chain, which might be helpful or required in the normal mode of operation. However, the second signal can furthermore comprise details and information concerning the length of the asynchronous latch chain, so that the power saving mode to be switched to upon receipt of the first signal can be selected not only depending on the position of the latch stage in the asynchronous latch chain, but also depending on the length of the asynchronous latch chain. For example, the sub-interfaces 120*b* and 130*a* of an embodiment of the apparatus can be switched off completely in a power saving mode, if the respective apparatus 100 is the last latch stage in the daisy chain, as no further apparatus are connected via these two sub-interfaces.

However, it should be noted that, although the apparatus is connectable as a latch stage to an asynchronous latch chain, different embodiments of an apparatus are not required to have two distinctive unidirectional bus structures comprised in the bus 140, 140' and 140". Furthermore, embodiments of the present invention are not limited to a single ended or differential transmission of signals at one or more sub-interfaces or interfaces of the apparatus 100. Moreover, embodiments of apparatus are not limited to a serial data transition, a parallel data transition, or a combination of both. Furthermore, an embodiment of the present invention is not limited to electrical communications. Further embodiments of the present invention can also comprise an optical, radio transmission or other signal transmission, as long as an embodiment of the present invention is connectable as a latch stage to an asynchronous latch chain.

In this context, it should be noted that in the framework of the present invention, two components, devices or structures being coupled to each other could be either directly connected to each other or connected via a further or third component, structure or element. As an example, two devices can be coupled together, either directly (e.g., via a wire or a signal line) or via an additional component such as a resistor, repeater, transducer or another component.

An embodiment of an apparatus 100, as shown in FIG. 1, offers the advantage of the power saving mode being switched to, to be selected based on the second signal, which can, for instance, comprise information concerning the position of the apparatus in the asynchronous latch chain. In other words, an embodiment of the present invention offers the possibility to select the power saving mode or the power-down mode, based on the position of the apparatus as a latch stage in the asynchronous latch chain and optionally, depending on the length of the asynchronous latch chain. Hence, an embodiment of the present invention offers the possibility of choosing or selecting between different power saving modes having different (characteristical) power consumptions and wake-up times. Therefore, if an embodiment of the apparatus is integrated into a latch stage being located near or at the end of the asynchronous latch chain, the power saving mode with the lower power consumption but a greater wake-up time can be chosen, while an embodiment of an apparatus being integrated in a latch stage close to the controller 110 can be maintained in a power saving mode, even in the power saving mode which enables a short wake-up time at the cost of a higher power consumption compared to a power saving mode with a longer wake-up time.

Therefore, an embodiment of an apparatus offers a reduction of the power consumption, while at the same time a wake-up time or a response time of the system comprising embodiments of the apparatus can be reduced by choosing or selecting for each embodiment of the apparatus 100, the power saving mode to be switched to on receipt of the first signal individually.

Before describing the second embodiment of the present invention in more detail, it should be noted that objects, structures and components with the same or similar function of the properties and features are denoted with the same reference signs. Unless explicitly noted otherwise, the description with respect to objects, structures and devices with similar or equal functional properties can be exchanged with respect to each other. Furthermore, in the following summarizing reference signs will be used to simplify the description. Hence, unless specific embodiments or a specific component or device is referred to, as an example an apparatus 100, 100' will be designated as apparatus 100.

FIG. 2 shows a further embodiment of a memory system comprising several embodiments of an apparatus 100, in the form of a memory buffer. To be more precise, the memory buffer 100 is arranged on a module board 200 of a memory module 210, which is also referred to as a fully buffered DIMM (FBDIMM; DIMM=Dual Inline Memory Module). Each memory module 210 comprises at least one memory device 220, which can, for instance, be a commodity DRAM memory device. Typically, a memory module comprises 4, 8, 16, or 32 individual memory devices 220. The memory module 210, shown in FIG. 2, comprises 8 DRAM memory devices 220 on top and 10 on bottom totaling to 18-memory devices on both sides of the memory modules 210. Two DRAM memory devices 220 of the 18 memory devices can for instance be used for Error Correction, e.g., for storing Error Correcting Codes.

The memory buffer 100 as an embodiment of an apparatus 100 is coupled to the DRAM memory devices 220 of the memory module 210 and provides a signal buffering and processing between the interfaces of the commodity DRAM memory devices 220 and a module interface 230, which is coupled to the appropriate interfaces 120a, 120b, 130a, 130b (see FIG. 1) of the memory buffer 100. Therefore, the memory buffer provides a transition between the signals provided to the memory buffer 100 via the module interface 230 and the specific signal requirement of the DRAM memory devices 220.

In this context, it should be noted that although in FIG. 2, that DRAM memory devices 220 (DRAM=Dynamically Random Access Memory) are shown, in principle, other memory devices such as SRAM (SRAM=Static Random Access Memory), non-volatile memory devices (e.g., flash memory) and other memory devices such as ROM memory devices (ROM=Read Only Memory) can be employed. In the field of DRAM memory devices, DDRx memory devices can, for instance, be employed, wherein x is a positive integer indicating the standard according to which the DDRx memory devices are fabricated. Accordingly, as an example DDR memory devices or DDR1 memory devices (x=1), as well as DDR2, DDR3 or DDR4 memory devices can be employed as memory devices 220.

According to the FBDIMM architecture up to 8 memory modules 210 or up to 8 DIMMs 210 can be arranged along with the memory controller of controller 110 in the daisy chain, formed by an asynchronous latch chain via the memory interface 230 (DDR2 connector with unique key). The memory controller 110 and the memory modules 210 are connected or coupled to each other via a bus 140, comprising 10 differential signal lines (i.e., 10 differential signal pairs) for southbound communication and 14 differential signal lines for northbound communication. The memory controller 110, as well as the memory buffers 100 which are usually referred to in the context of FBDIMM architectures as advanced memory buffers (AMB), AMB2 or AMB3, utilize a serial signaling similar to the signaling of PCI-Express on the bus 140.

The memory controller 110 is furthermore connected to each of the memory modules 210 via the so-called SM bus 160, which provides, for instance, access to the registers of the memory buffers 100 of all memory buffers 210. The SM bus is, compared to the bus 140, a low speed bus providing access to all memory modules 210 in parallel, as indicated in FIG. 2. The SM bus is not only used for accessing the registers of the memory buffers 100, but is also used in the framework of the startup of the memory system. For instance, over the SM bus, information concerning the addresses of the memory devices of each memory module 210 is transmitted to the memory buffer 100 of the respective memory module 210. Furthermore, the SM bus can be utilized for transmitting information concerning the length of the asynchronous latch chain or, in other words, the number of memory modules 210 connected or coupled to the memory controller.

Hence, the SM bus can be utilized to provide the memory buffers 100 of each memory module individually with information concerning the position of the memory buffer 100, with respect to the asynchronous latch chain formed by the memory buffers 100 or the memory modules 210, together with the memory controller 110 and concerning the length of the asynchronous latch chain or the daisy chain.

Furthermore, each of the memory modules 210, as well as the memory controller 110, is connected to a common clock source 240, as indicated in FIG. 2.

As outlined in the context of FIG. 1 the reception interface of the memory buffer 100, as an embodiment of the apparatus 100, comprises all interfaces, connections, terminals, (mechanical) jumpers, switches (DIP switches) and plugs, over which signals comprising data, clock signals, instructions, commands, status requests or other pieces of information, are provided to the memory buffer 100. In other words, the reception interface especially comprises the southbound sub-interface for receiving signals, the northbound sub-interface for receiving signals, the SM bus, and the clock line being connected to the common clock source 240.

As indicated earlier, in one embodiment of an apparatus 100, in the form of a memory buffer 100, the memory controller 110 provides each memory buffer 100 of the memory modules 210, for instance, via the SM bus 160 during the startup of the memory system with information concerning the number of memory modules 210, their capacity and their position with respect to the asynchronous latch chain, so that a basic address for the memory provided by the memory device 220 of a specific memory module 210 is defined. As a consequence, the memory buffer 100 of the specific memory module 210 is able to decide whether a request from the memory controller 110 relates to a memory unit of one of the memory devices 220 of the respective memory modules. In this case, the memory buffer 100 accesses the memory device and provides the data via the northbound bus structure of the bus 140 back to the memory controller 110. However, if the request, command, or another signal, not intended for the respective memory module 210, the memory buffer forwards the respective signals southbound the next memory module 210. Accordingly, signals will also be provided on the northbound bus structure of the bus 140 to the memory controller 110 by each of the memory buffers 100, which are reached by the respective signals.

An embodiment of an apparatus provides a compromise between the power saving and the time needed to switch back from the power saving mode to an active mode or another mode of operation, as this wake-up time severely influences the overall performance of the system, such as the memory system shown in FIG. 2. As indicated in the introductory parts of the present application, analog circuits, especially used in the interface of the module 230, have an enormous power saving potential, but need a comparatively long time to recover once it has been shut down or shut off. This is mainly caused due to the fact that these analog components require control loops and other feedback loops to reacquire and maintain stable working conditions.

An embodiment of an inventive apparatus 100, for instance, in the form of a memory buffer 100, is therefore, able to implement a method to reduce the wake-up time by introducing different power down modes or power saving modes, depending on the location of a place of the embodiment in the daisy chain of the memory system.

In other words, by taking the daisy chain configuration of modern memory systems into account, especially the daisy chain configuration of a FBDIMM system, the first element of the daisy chain has to react very fast after a wake-up has been initiated. In contrast, the last element of a last latch chain of the asynchronous latch chain has much more time to get into the active mode of a normal mode or the operation. Embodiments of the present invention therefore allow introducing different power-down modes or power saving modes with an optimized power saving/wake-up time ratio, depending on the location of the memory buffer 100 or the apparatus 100, or the FBDIMM 210 in the daisy chain.

In a memory system without employing an embodiment of an apparatus 100, a wake-up sequence is usually initiated by the memory controller through a wake-up signal to all memory buffers in the system followed by a special training sequence sent to the first memory buffer (AMB) allowing it to power-up and synchronize to incoming data. When a respective AMB has reached an operative stage, it starts to send this training sequence to the next following AMB, which is doing the same. In a system with n AMBs it therefore takes roughly twice the number of AMBs times the wake-up time until the memory system is up and running again, wherein n is a positive integer (i.e. up to 8 in the FBDIMM system). In other words, in a memory system without an inventive memory buffer as an embodiment of the present invention, the total wake-up time of the memory system is roughly 2·wake-up time, wherein the additional factor 2 is caused by the fact that both, the southbound and the northbound bus structures of the bus have to be initiated. As each of the memory modules or each of the DIMM fully communicates with its neighboring components, a typical time for a power-up sequence, as well as a typical time for a wake-up is in the range of several milliseconds.

An embodiment of an apparatus 100 in the form of a memory bus 100 implemented, for instance, as an advanced memory buffer on a FBDIMM 210 offers the advantage of reducing the overall power consumption in an inactive time by entering power-down mode for the memory system, wherein each advanced memory buffer (AMB) 100 of the different FBDIMM memory modules 210 enters a different power-down mode or power saving mode, depending on its position in the daisy chain.

As a consequence, the memory system is able to reduce the system wake-up time by introducing different power-down modes or power saving modes, which differ with respect to the wake-up times and the power savings/power consumption. The first element of the first memory buffer 100 in the chain connected to the memory controller 110 has to react very fast, and therefore, it is advisable to select a power saving mode for this memory buffer 100, which has a comparably short wake-up time. This however, reduces the power saving capabilities, with respect to the first memory module 210, as the long recovery time, which is for instance caused by shutting down the analog circuits of a memory buffer 100, is not advisable and can in some configurations and implementations, be not affordable at all. So, in other words, the power-down mode or power saving mode selected for the first memory buffer in the daisy chain, at least with respect to the southbound transmitting circuits comprised in the appropriate southbound interface, switches also mainly digital circuits with a very short recovery time. Due to shutting off, only the digital circuits, the power saving is in most cases, however, comparably small.

The last element in the chain, however, has much more time until it has reached an active state, as all the elements in the daisy chain first have to be woken up, before the signals can reach the last element in the daisy chain. Therefore, the last memory buffer 100, can easily be sent to a power-down mode or power saving mode with a very high power saving or a very low power consumption, which however, cause the respective memory buffer 100 to have a comparably long recovery time or wake-up time.

An embodiment of an apparatus 100, for instance, in the form of a memory buffer 100 and as shown in FIG. 2, cannot only select the power saving mode based on the physical or logical position of the apparatus 100 in the daisy chain of the appropriate system, but, as indicated earlier, in some of the embodiments the length of the daisy chain can also be also taken into account. The second signal, comprising at least one of the pieces of information mentioned above, can be provided by the memory controller 110 via an additional chip, unit or circuit arranged on the main board, comprising the memory controller, the bus 140 as well as the sockets for accommodating the memory modules 210 or via the hard wired circuit, which can, for instance, provide one or more connectors of the module interface 230, with a fixed or predefined signal level (e.g. a voltage or a potential), depending on the position of the socket accommodating the respective memory module 210.

As indicated earlier, the second signal can, however, be transmitted via the bus 140 from the memory controller to the respective memory buffers 100, or via an additional signal line or bus 160, which can be utilized for further tasks, for instance, in the framework of powering up the system. In the FBDIMM architecture, the SM bus can, for instance, be used for providing each of the memory buffers 100 with data frames indicating the position and optionally the length of the respective memory module 210 for providing the memory buffer 100 with information concerning a basic address of the memory provided by the memory devices 220 arranged on the respective module board 200 of the memory module 210. In other words, the second signal can be provided via the SM bus of the FBDIMM architecture to the ABMs 100.

In some embodiments of a memory system as shown in FIG. 2, the memory controller 110 provides the memory buffers 100 with a first signal causing the respective memory buffers 100 to switch to the respective power saving modes as indicated by the second signal. The first signal can also be provided via the bus 140, via the signal line or a bus 160, like the SM bus 160 in the case of a FBDIMM architecture. Usually, the memory controller provides all memory buffers 100 of the daisy chain with the first signal so that, as a consequence, all memory buffers of the daisy chain will be switched to the respective power saving modes.

However, for example, the power saving mode can be restricted to several, due to the daisy chain configuration, to the last memory modules 210 in the daisy chain. In such a mode of operation of the memory system, the first few memory modules remain in the normal mode of operation. In other words, an embodiment of an apparatus 100 enables the memory controller 110 to "artificially reduce" the available memory of the memory system temporarily by switching only a set of memory modules into a respective power saving mode. In such a configuration it might be advisable to provide the last memory buffer 100 operating in the normal mode of operation with information that the respective memory buffer 100 is, at least temporarily, the last memory module in the artificially reduced daisy chain, so that the respective memory buffer 100 does not wait for northbound signals coming from memory modules in a power saving mode and thereby accidentally reducing the bandwidth of the northbound bus.

However, in a further embodiment of a memory system, the first signal, as well as the second signal, can be provided by further components of the respective computer system. In other words, the first signal is also not required to be sent from the memory controller 110. Alternatively, the first signal can also be provided to the memory modules 210 and their memory buffers 100, for instance, directly from the processor or from another energy controlling or energy saving circuit in the computer system.

Apart from switching to different power-down modes, depending on the position in the chain or daisy chain of an embodiment of an apparatus 100, for instance, in the form of a memory buffer 100, but also an indication to all or at least some of the apparatus 100 in the chain, to leave their respective power saving modes and to return to a normal mode of operation, can lead to a reduction of the overall wake-up time of the memory system. Such an indication to wake-up can, for instance, be sent to all AMBs 100 or memory buffers 100, via an additional signal line 160 or the SM bus 160 in the case of the FBDIMM architecture. Of course, as previously explained with respect to the first signal and the second signal, the wake-up signal can also be provided not only by the memory controller 110 or the controller 110, but also by other components of the computer system, such as the processor or a power management system via the additional signal line 190.

In other words, compared to a possible solution of a memory bus structure, a different architecture comprising a way to wake up all memory buffers 100 (e.g. AMB1, AMB2 or AMB of the third generation) will be implemented. This can, for instance, be done via the SM bus 160 in the form of a SM bus command to all AMBs 100, via an extra signal line from the memory controller 110 connected to all AMBs 100, or the wake-up can be indicated from the memory controller 110 through a special state on the high speed lanes (of the bus 140), which can be rapidly rippled through one AMB 100 to the next one. In other words, the wake-up signal can, for instance, be provided by the memory controller 110 via a free bypass signal line or a free bypass wake-up signal line by transmitting a wake-up signal.

As indicated earlier, embodiments of the present invention offer the opportunity of directly influencing both, the power consumption and the wake-up time of an apparatus 100, for instance, depending on a physical or logical position in the daisy chain configuration and optionally, depending on the length of the daisy chain configuration, by selecting one power saving mode out of the plurality of power saving modes. In the case of a memory system according to the FBDIMM architecture, the power saving mode implemented in the embodiment of a memory buffer 100 cannot only differ with respect to analog circuit components and digital circuit components being switched off or deactivated according to the power saving mode, but also, components of the memory buffer 100 can be selectively switched on, depending on the direction of the bus structure of the bus 140 to which they are connected. As the southbound communication is directed away from the memory controller 110, as shown in FIG. 2, the wake-up time for the southbound direction of communication should be smaller than the northbound communication, as a northbound communication usually requires all memory modules 210 to be able to receive data via the southbound bus structure of the bus 140. Theoretically, up to $2^n$ different power saving modes or power-down modes can be implemented, wherein n is the number of memory modules 210 being connectable into the daisy chain or the memory system.

However, n different power saving modes, one for each different memory module 210, will usually be sufficient, unless an artificial reduction of the daisy chain, as explained above, is intended to be implemented. Furthermore, in some practical implementations, it might also be sufficient implementing three or four modes only, in the case of a system comprising of up to 8 different memory modules 210 (n=8).

In the case of a memory system, according to the FBDIMM architecture with an embodiment of an apparatus 100 in the form of an advanced memory buffer (e.g., AMB1, AMB2 or AMB of a third generation), transmitter a component circuit and a receiver component circuit intended for a communication in the southbound direction should be able to be activated quickly, whereas the northbound component circuits (transmitter component circuit, receiver component circuit) offer, in principle, a greater power saving potential as these components are usually not required to have short wake-up times as the corresponding southbound components. While, for instance, especially in the context of the first memory modules 210 in the daisy chain, with respect to the southbound direction, only digital components or digital transmitter component circuits can usually be switched off without increasing the wake-up time to an unacceptable level. Examples of sub-digital components are multiplexers, upsampler and downsampler necessary for changing signals transported via the bus 140, into signals suitable for the memory devices 220, arranged on the module board 200 of the memory module 210. In some situations, only analog transmitter component circuits of the last few memory modules 210 in the daisy chain, can be safely switched off. However, with respect to the northbound communication, especially the first memory module 210 in the daisy chain configuration can be switched off in terms of both, the analog and the digital transmitter component circuits. With respect to the northbound component circuit the transmitter component circuits of the last few memory modules 210 in the daisy chain configuration will, most probably, be switched to a power saving mode, which provides, in terms of the northbound communication, a shorter wake-up time as compared to the memory modules 210, or rather the advanced memory buffers 100, located in the direct vicinity of the memory controller 110.

In other words, in terms of northbound communication, the first few memory modules (e.g., the first, the first two, or the first four memory modules 210) can be switched off in terms of digital and analog transmitter component circuits, such as a PLL circuit (PLL=Phase Lock Loop) and other analog components. However, as the receiver component circuits, especially the digital receiver component circuit, do not offer a sufficiently large power saving capability, these component circuits will most probably be switched off only in terms of the northbound communication channel, in the case of the wake-up signal not being required to be received by these components. Hence, the receivers or the receiver component circuits will most probably, only be switched off in the deepest power saving mode in a concrete implementation.

In order to facilitate a deactivation or a switching off of several components, or component circuits, embodiments of an apparatus 100 can comprise a switch circuit coupled to the aforementioned components, such that the switching circuit is able to activate or deactivate at least some of these components, depending on the power saving mode, as indicated by the second signal.

Embodiments of the present invention are not limited to memory systems, especially to a FBDIMM architecture. Embodiments of the present invention can be implemented in any daisy chain system involving electrical, optical, or other signal communication in the form of an asynchronous latch chain.

Depending on certain implementation requirements of embodiments of the inventive methods, embodiments of the inventive methods can be implemented in hardware or in software. The implementation can be performed using a digital storage medium, in particular, a disc, a CD or a DVD having an electronically readable control signal stored thereon, which cooperates with a programmable computer system, a processor or another integrated circuit, such that an embodiment of the inventive methods is performed. Generally, an embodiment of the present invention is, therefore, a computer program product with a program code stored on the machine-readable carrier, the program code being operative for performing embodiments of the inventive methods when the computer program runs a computer. In other words, embodiments of the inventive method, are therefore, a computer program having a program code for performing at least one of the inventive methods, when the computer program runs on a computer, a processor or another integrated circuit. While the foregoing has been particularly shown and described with reference, the particular embodiments thereof will be understood by those skilled in the art that various other changes in the form and details may be made, without departing from the spirit and scope thereof.

It is to be understood that various changes may be made in adapting to different embodiments without departing from the broader concepts disclosed herein and comprehended by the claims that follow.

What is claimed is:

1. An apparatus being connectable, as a latch stage, into an asynchronous latch chain having a length, the apparatus comprising:
   a reception interface,
      wherein upon receipt of a first signal at the reception interface the apparatus switches to one of a first power saving mode and a second power saving mode depending on a second signal at the reception interface, the second signal comprising information concerning the length of the asynchronous latch chain; and
      wherein the apparatus offers a first power consumption and a first wake-up time in the first power saving mode and a second power consumption and a second wake-up time in the second power saving mode.

2. The apparatus according to claim 1, wherein the first wake-up time is shorter than or equal to the second wake-up time and the first power consumption is higher than the second power consumption or wherein the first wake-up time is shorter than the second wake-up time and the first power consumption is higher than or equal to the second power consumption.

3. The apparatus according to claim 1, wherein the first power consumption is higher than the second power consumption and wherein the first wake-up time is shorter than the second wake-up time.

4. The apparatus according to claim 1, wherein the second signal comprises information concerning a position of the apparatus as a latch stage in the asynchronous latch chain.

5. The apparatus according to claim 1, further comprising a second interface connectable to at least one memory unit of at least one memory device, wherein the at least one memory unit is addressable by an address, and, wherein the address depends on the second signal.

6. The apparatus according to claim 1, further comprising a switch circuit coupled to at least one transmitter circuit comprising at least one transmitter component circuit and to at least one receiver circuit comprising at least one receiver component circuit, such that the switch circuit is able to activate or deactivate at least one of the at least one transmitter component circuit and the at least one receiver component circuit based on the first signal and depending on a power saving mode of the first power saving mode and the second power saving mode.

7. The apparatus according to claim 6, wherein the at least one transmitter circuit comprises an analog transmitter component circuit and a digital transmitter component circuit, and wherein the at least one receiver circuit comprises an analog receiver component circuit and a digital receiver component circuit.

8. The apparatus according to claim 1, wherein the reception interface comprises an input for receiving the first signal.

9. The apparatus according to claim 1, wherein the apparatus offers a plurality of power saving modes comprising the first power saving mode and the second power saving mode, wherein each power saving mode of the plurality of power saving modes offers a respective power consumption and a respective wake-up time, wherein the longer the respective wake-up time of a power saving mode the less the power consumption of the respective power saving mode.

10. The apparatus according to claim 1, wherein the apparatus is part of a memory buffer and wherein at least one signal line of the reception interface is a signal line connectable to an asynchronous latch chain for memory modules.

11. The apparatus according to claim 1, wherein the reception interface comprises an input for receiving the second signal as a physical signal, a SM bus interface coupled to a register for accessing and storing the second signal or an asynchronous latch chain interface for receiving the second signal.

12. An apparatus being connectable, as a latch stage, into an asynchronous latch chain having a length, the apparatus comprising:
  a reception interface; and
  a second interface, via which at least one memory unit of a memory device is addressable by an address,
  wherein upon a receipt of a first signal at the reception interface the apparatus switches to one of a first power saving mode and a second power saving mode depending on a second signal at the reception interface, the second signal comprising information concerning the length of the asynchronous latch chain;
  wherein the apparatus offers a first power consumption and a first wake-up time in the first power saving mode and a second power consumption and a second wake-up time in the second power saving mode; and
  wherein the address of the at least one memory unit depends on the second signal.

13. The apparatus according to claim 12, wherein the first wake-up time is shorter than or equal to the second wake-up time and the first power consumption is higher than the second power consumption or wherein the first wake-up time is shorter than the second wake-up time and the first power consumption is higher than or equal to the second power consumption.

14. The apparatus according to claim 12, wherein the first power consumption is higher than the second power consumption and wherein the first wake-up time is shorter than the second wake-up time.

15. The apparatus according to claim 12, wherein the second signal comprises information concerning a position of the apparatus as a latch chain in the asynchronous latch chain.

16. The apparatus according to claim 12, further comprising a switch circuit coupled to at least one transmitter circuit comprising at least one transmitter component circuit and to at least one receiver circuit comprising at least one receiver component circuit, such that the switch circuit is able to activate or deactivate at least one of the at least one transmitter component circuit and the at least one receiver component circuit based on the first signal and dependent on the first power saving mode or the second power saving mode.

17. The apparatus according to claim 16, wherein the at least one transmitter circuit comprises an analog transmitter component circuit and a digital transmitter component circuit, wherein the at least one receiver circuit comprises an analog receiver component circuit and a digital receiver component circuit.

18. The apparatus according to claim 12, wherein the reception interface comprises an input signal line for receiving the first signal.

19. The apparatus according to claim 12, wherein the apparatus is part of a memory buffer and wherein at least one signal line of the reception interface is part of an asynchronous latch chain interface.

20. The apparatus according to claim 12, wherein the reception interface comprises an input for receiving the second signal as a physical signal, a SM bus interface coupled to a register for accessing and storing the second signal or an asynchronous latch chain interface for receiving the second signal.

21. An apparatus being connectable, as a latch stage, into an asynchronous latch chain having a length, the apparatus comprising:
  means for receiving a first signal and a second signal; and
  means for switching to one of a first power saving mode and a second power saving mode depending on the second signal upon receipt of the first signal, the second signal comprising information concerning the length of the asynchronous latch chain,
  wherein the apparatus offers a first power consumption and a first wake-up time in the first power saving mode and a second power consumption and a second wake-up time in the second power saving mode.

22. The apparatus according to claim 21, wherein the first wake-up time is shorter than or equal to the second wake-up time and the first power consumption is higher than the second power consumption or wherein the first wake-up time is shorter than the second wake-up time and the first power consumption is higher than or equal to the second power consumption.

23. The apparatus according to claim 21, wherein the first power consumption is higher than the second power consumption and wherein the first wake-up time is shorter than the second wake-up time.

24. The apparatus according to claim 21, wherein the second signal comprises information concerning a position of the apparatus as a latch stage in the asynchronous latch chain.

25. A method for switching an apparatus to a power saving mode, the apparatus being connectable, as a latch stage, into an asynchronous latch chain having a length, the method comprising:
  receiving a second signal;
  receiving a first signal; and
  switching to one of a first power saving mode and a second power saving mode depending on the second signal upon receipt of the first signal, the second signal comprising information concerning the length of the asynchronous latch chain,
  wherein the first power saving mode offers a first power consumption and a first wake-up time; and wherein the second power saving mode offers a second power consumption and a second wake-up time.

26. The method according to claim 25, wherein the first wake-up time is shorter than or equal to the second wake-up time and the first power consumption is higher than the second power consumption or wherein the first wake-up time is shorter than the second wake-up time and the first power consumption is higher than or equal to the second power consumption.

27. The method according to claim 25, wherein the first power consumption is higher than the second power consumption and wherein the first wake-up time is shorter than the second wake-up time.

28. The method according to claim 25, wherein the second signal comprises information concerning a position of the apparatus as a latch stage in the asynchronous latch chain.

29. A method for switching an apparatus to a power saving mode in an apparatus being connectable, as a latch stage, into an asynchronous latch chain having a length with a memory device comprising at least one memory unit designated by an address, the method comprising:
  receiving a second signal, the second signal comprising information concerning the length of the asynchronous latch chain;
  selecting a power saving mode of a first power saving mode and a second power saving mode depending on the second signal;
  receiving a first signal;
  switching to the selected power saving mode upon receipt of the first signal,
  wherein the first power saving mode offers a first power consumption of the apparatus and a first wake-up time of the apparatus;
  wherein the second power saving mode offers a second power consumption of the apparatus and a second wake-up time of the apparatus; and
  wherein the second signal comprises information concerning a position of the apparatus in the asynchronous latch chain.

30. The method according to claim 29, wherein the first wake-up time is shorter than or equal to the second wake-up time and the first power consumption is higher than the second power consumption or wherein the first wake-up time is shorter than the second wake-up time and the first power consumption is higher than or equal to the second power consumption.

31. The method according to claim 29, wherein the first power consumption is higher than the second power consumption and wherein the first wake-up time is shorter than the second wake-up time.

32. A computer program product with a program code stored on the machine-readable medium, the program code being operative for performing, when running on a computer, a method for switching an apparatus to a power saving mode, the apparatus being connectable, as a latch stage, into an asynchronous latch chain having a length, the method comprising:
  receiving a second signal, the second signal comprising information concerning the length of the asynchronous latch chain;
  receiving a first signal; and
  switching to one of a first power saving mode and a second power saving mode depending on the second signal upon receipt of the first signal,
  wherein the first power saving mode offers a first power consumption and a first wake-up time; and
  wherein the second power saving mode offers a second power consumption and a second wake-up time.

33. A computer program product with a program code stored on the machine-readable medium, the program code being operative for performing, when running on a computer, a method for switching an apparatus to a power saving mode, the apparatus being connectable, as a latch stage, into an asynchronous latch chain having a length, the method comprising:
  receiving a second signal, the second signal comprising information concerning the length of the asynchronous latch chain;
  selecting a power saving mode of a first power saving mode and a second power saving mode depending on a second signal;
  receiving a first signal;
  switching to the selected power saving mode upon receipt of the first signal,
  wherein the first power saving mode offers a first power consumption of the apparatus and a first wake-up time of the apparatus;
  wherein the second power saving mode offers a second power consumption of the apparatus and a second wake-up time of the apparatus; and
  wherein the second signal comprises information concerning a position of the apparatus in the asynchronous latch chain.

* * * * *